(12) United States Patent
Ando

(10) Patent No.: US 6,567,320 B2
(45) Date of Patent: May 20, 2003

(54) DATA WRITE CIRCUIT

(75) Inventor: Tomoaki Ando, Fujieda (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 10/186,861

(22) Filed: Jul. 1, 2002

(65) Prior Publication Data

US 2003/0035323 A1 Feb. 20, 2003

(30) Foreign Application Priority Data

Jul. 2, 2001 (JP) ........................................ 2001-201254

(51) Int. Cl.[7] ................................................. G11C 7/00
(52) U.S. Cl. ............................. 365/189.12; 365/189.01; 365/230.06
(58) Field of Search ........................ 365/189.12, 189.01, 365/230.06

(56) References Cited

U.S. PATENT DOCUMENTS 6,356,485 B1 * 3/2002 Proebsting ............. 365/189.01
6,377,501 B2 * 4/2002 Maesako et al. ........ 365/230.03
6,396,732 B1 * 5/2002 Osada et al. ................ 365/156
6,404,671 B1 * 6/2002 Reohr et al. ................ 365/158
6,453,400 B1 * 9/2002 Maesako et al. ............ 711/167

* cited by examiner

Primary Examiner—Michael S. Lebentritt
Assistant Examiner—Tuan T. Nguyen
(74) Attorney, Agent, or Firm—Pillsbury Winthrop LLP

(57) ABSTRACT

A data write circuit is interposed between a CPU and memory, both of which operate based on the same number of bits (e.g., thirty-two bits). The CPU produces address data for designating a specific address in the memory, and access mode designation data for designating one of a byte access mode, half-word access mode, and word access mode. The data write circuit comprises a decoder for decoding the access mode designation data, a logic circuit for generating selection signals, and four selectors, each of which deals with 8-bit data consisting of eight prescribed bits of the original thirty-two bits. Each selector selects either first data read from the memory or second data output from the CPU. Therefore, each selector is capable of selecting the second data, which are substituted for the first data in the memory. Thus, it is possible to perform write operations in desired units in the memory.

10 Claims, 11 Drawing Sheets

DATA WRITE CIRCUIT

BACKGROUND OF THE INVENTION

1. Field of the Invention

This invention relates to data write circuits that write data to semiconductor memories, in particular to data write circuits that are capable of writing data in prescribed units of bits, which differ from the units of bits originally employed in computers and digital signal processors (DSP), for example.

2. Description of the Related Art

Recently, small-size computers such as personal computers normally have central processing units (CPU) that operate in prescribed units of bits, such as thirty-two two bits. Hence, semiconductor memories installed in computers perform read/write operations in prescribed units of bits, such as thirty-two bits. Conventionally, however, there exist numerous software programs that perform read/write operations in units of bytes (eight bits). For this reason, conventional software programs require circuits that enable accessing memories in units of bytes under the control of 32-bit CPUs.

FIG. 11 is a block diagram showing a typical example of a circuit configuration having a byte-accessing capability under the control of a 32-bit CPU. Herein, reference numeral 1 designates a 32-bit CPU; reference numerals 2a to 2d designate static random-access memories (SRAMs) that perform read/write operations in units of bytes; reference numeral 3 designates a control circuit that realizes accessing in units of bytes. The CPU 1 provides 32-bit address data, which is designated by A(31:00) wherein the number '31' in the left side of the parentheses designates bit 31 within thirty-two bits, and the number '00' in the right side of the parentheses designates bit 0 of thirty-two bits. Herein, the lowermost two bits, namely bit 0 and bit 1 of the 32-bit address data A(31:00) are supplied to the control circuit 3, and the other bits, namely address data A(31:02) ranging from bit 2 to bit 31, are commonly supplied to address terminals a(n:0) of the SRAMs 2a to 2d. The SRAM 2a has an input terminal i(7:0) and an output terminal o(7:0), both of which are arranged for the first byte ranging from bit 0 to bit 7 of the 32-bit data of the CPU 1. Similarly, the SRAM 2b has an input terminal i(15:8) and an output terminal o(15:8), both of which are arranged for the second byte ranging from bit 8 to bit 15; the SRAM 2c has an input terminal i(23 :16) and an output terminal o(23:16), both of which are arranged for the third byte ranging from bit 16 to bit 23, and the SRAM 2d has an input terminal i(31:24) and an output terminal o(31:24), both of which are arranged for the fourth byte ranging from bit 24 to bit 31. The aforementioned input terminals and output terminals of the SRAMs 2a to 2 d are respectively connected with data terminals D(31:00) for 32-bit data ranging from bit 0 to bit 31, as follows:

SRAM 2a: both the input terminal and output terminal are connected together with data terminals for the first byte ranging from bit 0 to bit 7 of the 32-bit data of the CPU 1.

SRAM 2b: both the input terminal and output terminal are connected together with data terminals for the second byte ranging from bit 8 to bit 15 of the 32-bit data of the CPU 1.

SRAM 2c: both the input terminal and output terminal are connected together with data terminals for the third byte ranging from bit 16 to bit 23 of the 32-bit data of the CPU 1.

SRAM 2d: both the input terminal and output terminal are connected together with data terminals for the fourth byte ranging from bit 24 to bit 31 of the 32-bit data of the CPU 1.

In addition, the CPU 1 also provides to the control circuit 3 a signal VA that designates either a byte access mode or a word (32 bits) access mode.

In the aforementioned circuit configuration shown in FIG. 11, the CPU 1 provides a signal VA of '0' to the control circuit 3 in order to perform write operations in units of words. In this case, the CPU 1 supplies the address data A(31:02) to the SRAMs 2a to 2 d respectively. Additionally, the CPU 1 supplies write data D(31:00) consisting of bit 0 to bit 31 in such a way that bit 0 to bit 7 are supplied to the SRAM 2a, bit 8 to bit 15 are supplied to the SRAM 2b, bit 16 to bit 23 are supplied to the SRAM 2c, and bit 24 to bit 31 are supplied to the SRAM 2d. Incidentally, the lowermost two bits, namely bit 0 and bit 1, of the address data A(31:00) are irrelevant to the circuit operation. When the control circuit 3 detects the signal VA of '0' output from the CPU 1, it outputs write enable signals WENa to WENd to the SRAMs 2a to 2d respectively. Thus, all the write data D(31:00) output from the CPU 1 are completely written to the SRAMs 2a to 2d.

The CPU 1 provides a signal VA of '1' to the control circuit 3 in order to perform write operations in units of bytes. In this case, the CPU supplies the address data A(31:02) to the SRAMs 2a to 2 d respectively, while it supplies address data A(1) and A(0) to the control circuit 3. Additionally, the CPU 1 commonly supplies write data D to all the SRAMs 2a to 2d. Then, the CPU 1 supplies a write enable signal WEN to one of the SRAMs 2a to 2d, which is designated by the address data A(0) and A(1). In the case where both the address data A(0) and A(1) are set to '0', for example, the CPU 1 supplies a write enable signal WENa to the SRAM 2a. Thus, the write data D output from the CPU 1 are written to only the SRAM 2a.

As described above, the data write circuit having byte-accessing capability conventionally requires multiple memories in order to perform read/write operations in units of bytes. Therefore, the data write circuit performs control for each of the memories. This results in unwanted complexity in the configuration of the control circuit. In addition, the overall size of the memory chip(s) increases because of increases in the wiring regions between memories.

SUMMARY OF THE INVENTION

It is an object of the invention to provide a data write circuit having word/byte-accessing capabilities, which is realized by a simple configuration of a control circuit with a noticeable reduction of the size of a memory chip.

A data write circuit of this invention is interposed between the CPU and memory, both of which operate based on the same number of bits (e.g., thirty-two bits). The CPU produces address data for designating a specific address in the memory, and access mode designation data for designating one of the byte access mode, half-word access mode, and word access mode. The data write circuit comprises a decoder for decoding the access mode designation data, a logic circuit for generating selection signals, and four selectors, each of which deal with 8-bit data consisting of eight prescribed bits of the original thirty-two bits. Each selector selects either first data read from the memory or second data output from the CPU.

When the access mode designation data designates the byte access mode, one of the selectors is forced to select the second data, which are substituted for the first data in the memory. That is, it is possible to replace a specific byte in the memory with new data provided from the CPU. For example, only the low-order eight bits consisting of bit 0 to bit 7 are replaced with the corresponding data output from the CPU in the memory. When the access mode designation data designates the half-access mode, two of the selectors are forced to select the second data, which are substituted for the first data in the memory. That is, it is possible to replace a specific half-word in the memory by new data provided from the CPU. When the access mode designation data designates the word access mode, all the selectors are forced to select the second data, which are substituted for the first data in the memory. Thus, it is possible to entirely replace a word in the memory by new data provided from the CPU. Incidentally, it is possible to use a register instead of the memory.

BRIEF DESCRIPTION OF THE DRAWINGS

These and other objects, aspects, and embodiments of the present invention will be described in more detail with reference to the following drawings, in which.

Figure 7:
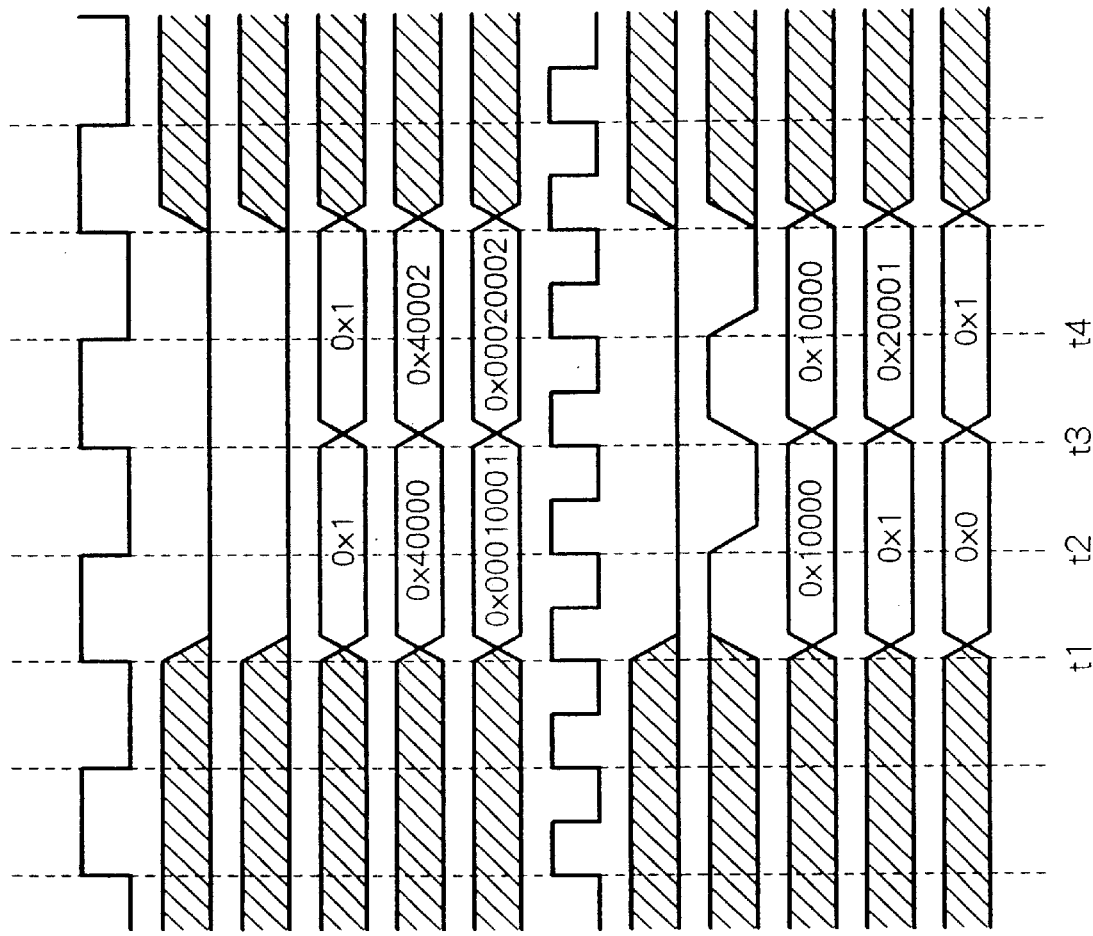
FIG. 7A is a time chart showing a system clock signal CPU-CK.
FIG. 7B is a time chart showing a chip select signal CSN.
Figure 8:
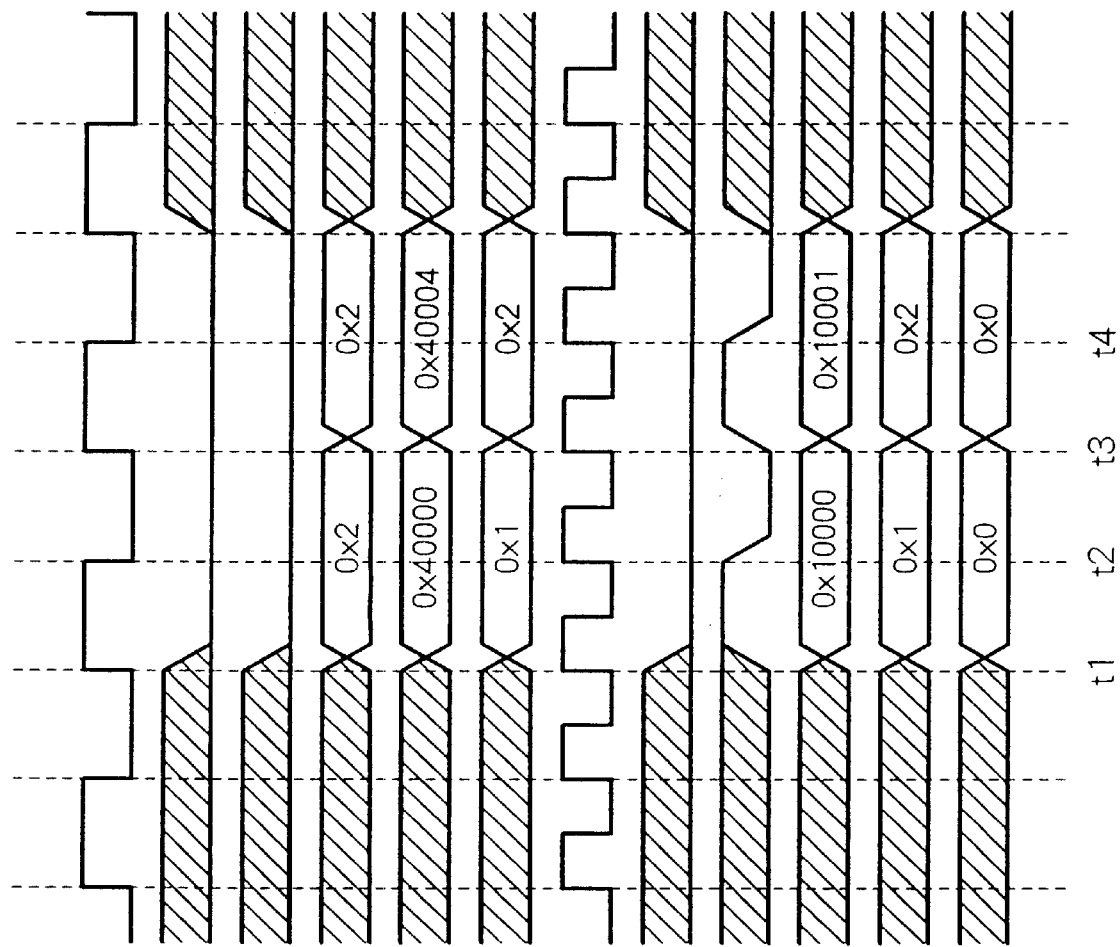
Figure 9:
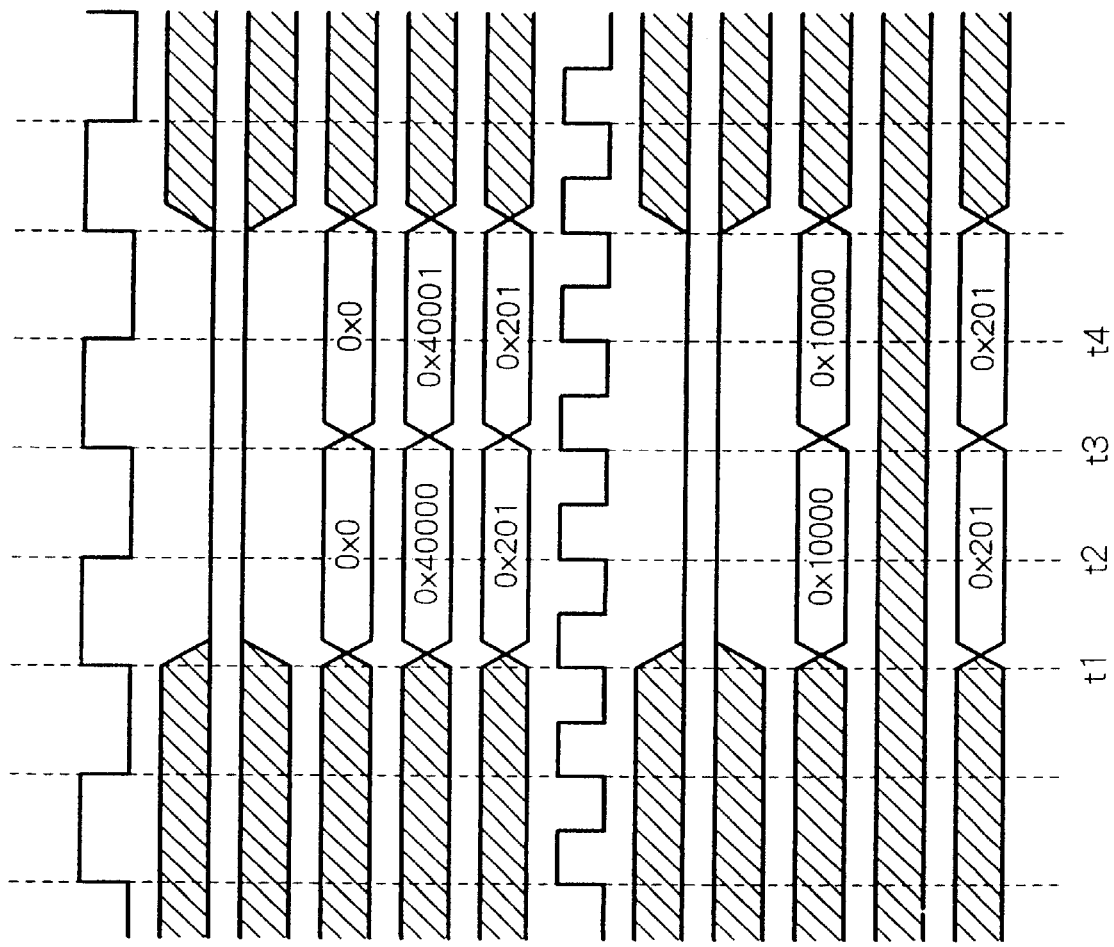
Figure 10:
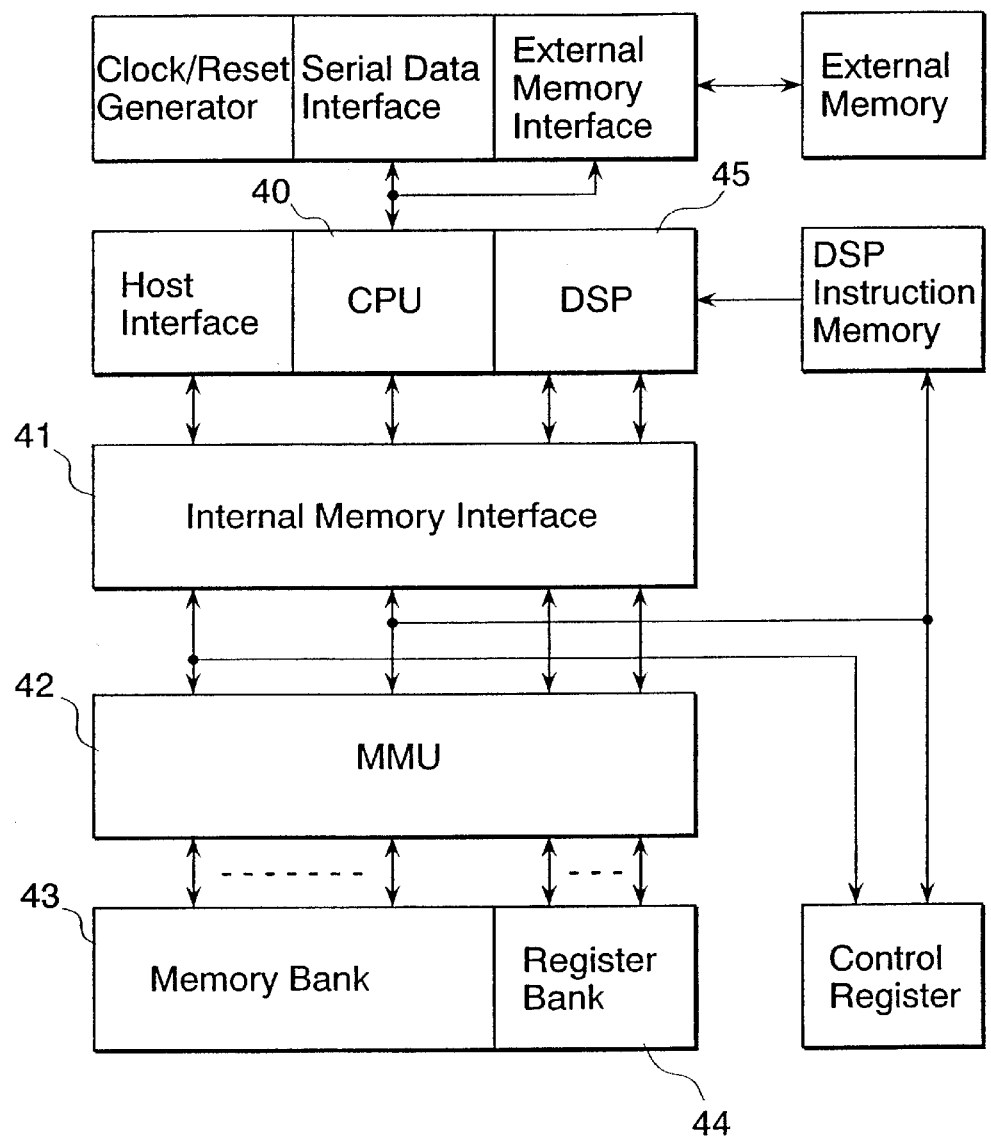
Figure 11:
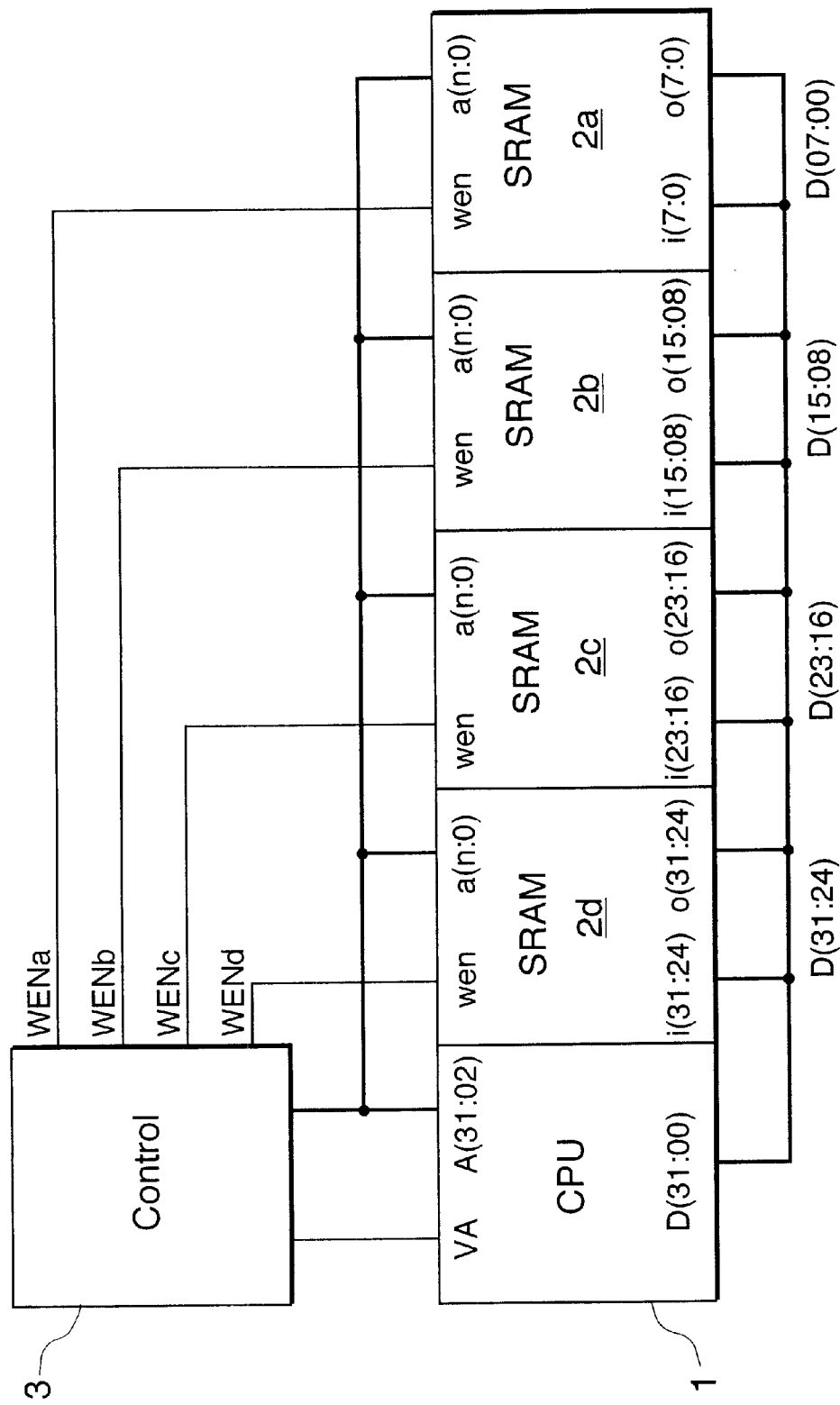

FIG: 7C is a time chart showing a write enable signal WEN;

FIG. 7D is a time chart showing access mode designation data DS having a value '1';

FIG. 7E is a time chart showing address data A(31:0) of the CPU;

FIG. 7F is a time chart showing output data O(31:0) of the CPU;

FIG. 7G is a time chart showing a memory clock signal M-CK;

FIG. 7H is a time chart showing a signal CSN1 output from the data write circuit based on the chip select signal CSN;

FIG. 7I is a time chart showing a signal WEN1 output from the data write circuit based on the write enable signal WEN;

FIG. 7J is a time chart showing address data A1(n:0) of the memory;

FIG. 7K is a time chart showing input data I1(31:0) of the memory;

FIG. 7L is a time chart showing output data O1(31:0) of the memory;

FIG. 8A is a time chart showing a system clock signal CPU-CK;

FIG. 8B is a time chart showing a chip select signal CSN;

FIG. 8C is a time chart showing a write enable signal WEN;

FIG. 8D is a time chart showing access mode designation data DS having a value '2';

FIG. 8E is a time chart showing address data A(31:0) of the CPU;

FIG. 8F is a time chart showing output data O(31:0) of the CPU;

FIG. 8G is a time chart showing a memory clock signal M-CK;

FIG. 8H is a time chart showing a signal CSN1 output from the data write circuit based on the chip select signal CSN;

FIG. 8I is a time chart showing a signal WEN1 output from the data write circuit based on the write enable signal WEN;

FIG. 8J is a time chart showing address data A1(n:0) of the memory;

FIG. 8K is a time chart showing input data I1(31:0) of the memory;

FIG. 8L is a time chart showing output data O1(31:0) of the memory;

FIG. 9A is a time chart showing a system clock signal CPU-CK;

FIG. 9B is a time chart showing a chip select signal CSN;

FIG. 9C is a time chart showing a write enable signal WEN;

FIG. 9D is a time chart showing access mode designation data DS having a value '0';

FIG. 9E is a time chart showing address data A(31:0) of the CPU;

FIG. 9F is a time chart showing output data O(31:0) of the CPU;

FIG. 9G is a time chart showing a memory clock signal M-CK;

FIG. 9H is a time chart showing a signal CSN1 output from the data write circuit based on the chip select signal CSN;

FIG. 9I is a time chart showing a signal WEN1 output from the data write circuit based on the write enable signal WEN;

FIG. 9J is a time chart showing address data A1(n:O) of the memory;

FIG. 9K is a time chart showing input data I1(31:0) of the memory;

FIG. 9L is a time chart showing output data O1(31:0) of the memory;

FIG. 10 is a block diagram showing an example of a decoder using the data write circuit for use in an AV amplifier; and FIG. 11 is a block diagram showing a typical example of a data write circuit having byte-accessing capability using four SRAMs interconnected together with a CPU and a control circuit.

DESCRIPTION OF THE PREFERRED EMBODIMENT

This invention will be described in further detail by way of examples with reference to the accompanying drawings.

Figure 1:
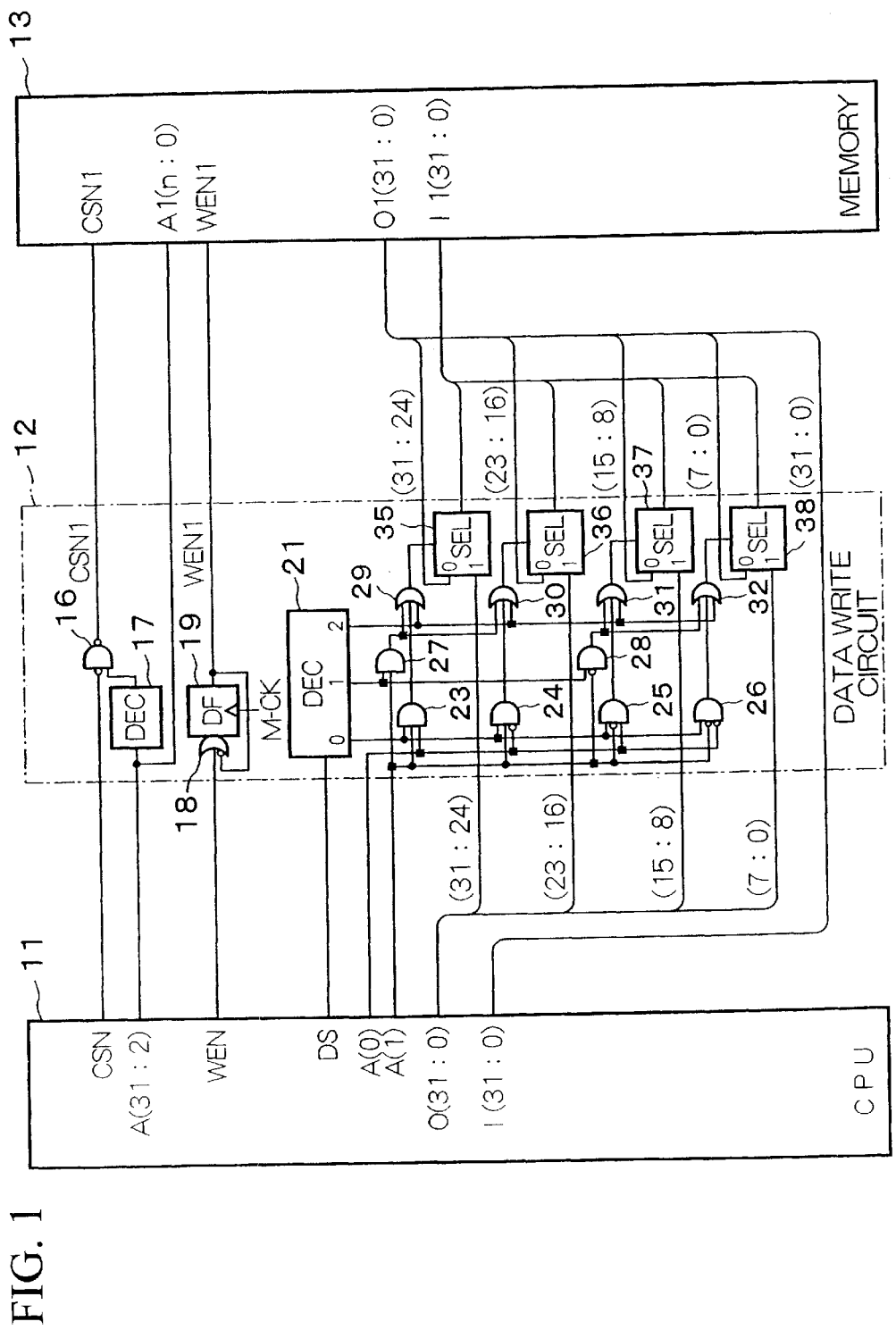
FIG. 1 is a circuit diagram showing an example of computer circuitry using a data write circuit in accordance with the preferred embodiment of the invention.

FIG. 1 is a circuit diagram showing an example of computer circuitry using a data write circuit in accordance with the preferred embodiment of the invention. Herein, reference numeral 11 designates a 32-bit CPU; 12 designates a data write circuit; and 13 designates a memory that is accessed in units of words (32 bits). This computer circuitry has various types of memory accessing capabilities, wherein the memory 13 is accessed in units of bytes (8 bits), in units of half-words (16 bits), and in units of words (32 bits). The data write circuit 12 is not necessarily designed for the memory 13, which can be replaced by a 32-bit register. Details of the data write circuit 12 that deal with the 32-bit register will be described later.

In the data write circuit 12 shown in FIG. 1, reference numeral 16 designates a NAND gate that is supplied with a chip select signal CSN from the CPU 11; 17 designates a decoder that decodes address data A(31:2) output from the CPU 11; 18 designates an OR gate that is supplied with a write enable signal WEN from the CPU 11; 19 designates a D flip-flop (or D-type flip-flop: DF) whose clock terminal receives a memory clock signal M-CK (see FIG. 2G). The memory clock signal M-CK has a frequency that is two times the frequency of a system clock signal CPU-CK (see FIG. 2A) of the CPU 11.

In addition, reference numeral 21 designates a decoder that decodes access mode designation data DS output from the CPU 11. That is, the decoder 21 decodes the access mode designation data DS to provide three outputs, namely '0' designating a byte (8-bit) transfer mode, '1' designating a half-word (16-bit) transfer mode, and '2' designating a word (32-bit) transfer mode. Reference numerals 23 to 26 designate three-input-type AND gates, each of which performs an AND operation based on address data A(1) and A(0) (namely, bit 1 and bit 0 of the 32-bit address data) output from the CPU 11, and the value of the output terminal '0' of the decoder 21. Specifically, the AND gates 23–26 differ from each other in the arrangement of negated inputs (or inverters), which are represented by small circle marks in FIG. 1. That is, the third input of the AND gate 24 receiving the address data A(0) is a negated input; the second input of the AND gate 25 receiving the address data A(1) is a negated input; and the second and third inputs of the AND gate 26 receiving the address data A(1) and A(0) respectively are negated inputs. Reference numerals 27 and 28 designate two-input-type AND gates, each of which performs an AND operation based on the address data A(1) and the value of the output terminal '1' of the decoder 21. Herein, the second input of the AND gate 28 receiving the address data A(1) is a negated input. Reference numerals 29 to 32 designate three-input-type OR gates. The first inputs of the OR gates 29 and 30 receive the output of the AND gate 27, while the first inputs of the OR gates 31 and 32 receive the output of the AND gate 28. The second inputs of the OR gates 29 to 32 receive the outputs of the AND gates 23 to 26 respectively. All the third inputs of the OR gates 29 to 32 receive the value of the output terminal '2' of the decoder 21. Reference numerals 35 to 38 designate 8-bit selectors, each of which has two inputs (namely, '0' and '1') for receiving 8-bit data. In response to the outputs of the OR gates 29 to 32, the selectors 35 to 38 each select one of the two inputs (namely, '0' or '1') thereof, so that the selected input is output therefrom.

Next, the overall operation of the computer circuitry shown in FIG. 1 will be described in detail with reference to the time charts shown in FIGS. 2A–2L through FIGS. 9A–9L. All addresses and data are expressed in hexadecimal notation, wherein in the time charts, the number following '0x' is represented in hexadecimal notation.

1. Memory Byte Write

Figure 2:
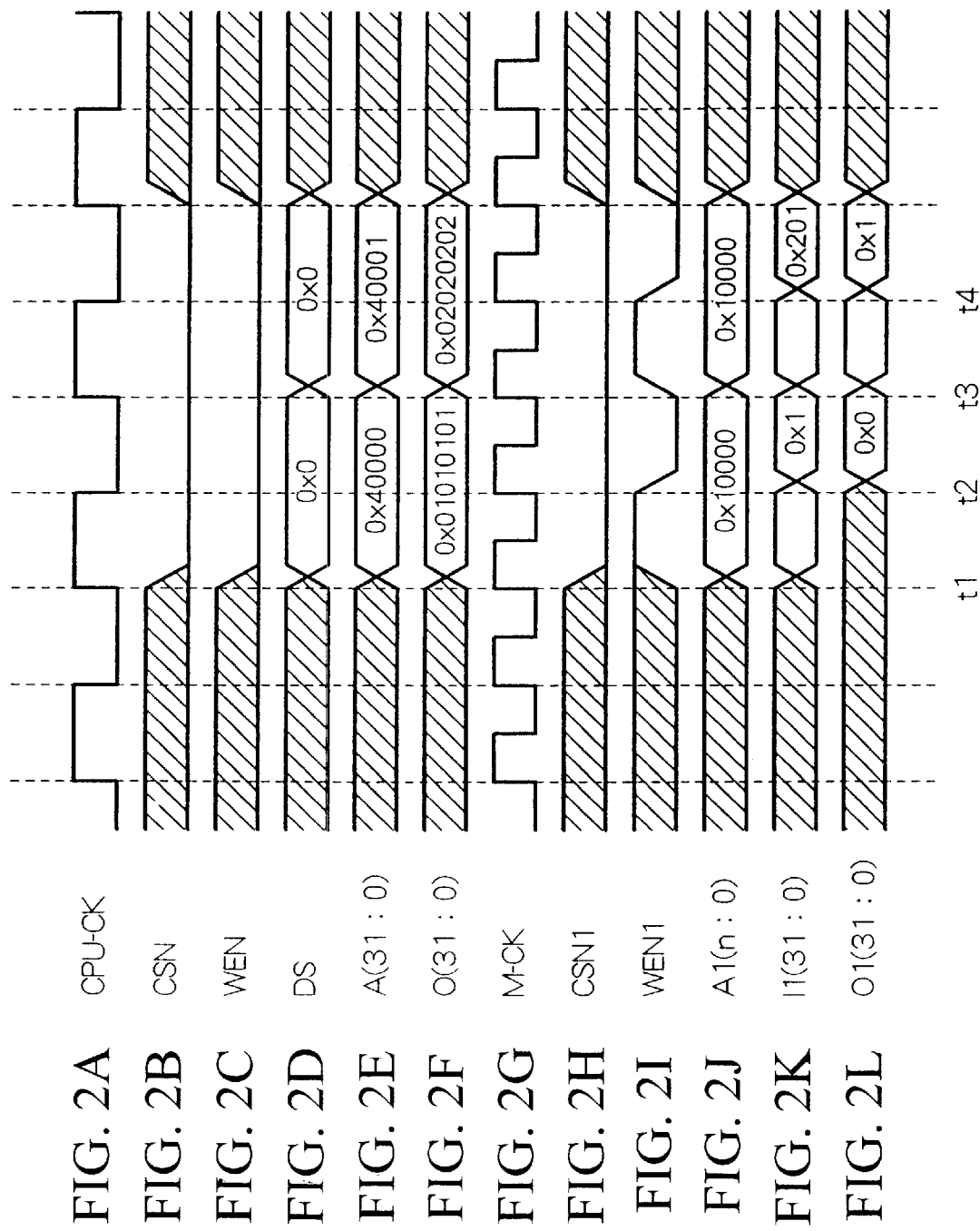
FIG. 2A is a time chart showing a system clock signal CPU-CK for use in a CPU shown in FIG. 1.
FIG. 2B is a time chart showing a chip select signal CSN output from the CPU.
FIG. 2C is a time chart showing a write enable signal WEN output from the CPU.
FIG. 2D is a time chart showing access mode designation data DS having a value '0' output from the CPU.
FIG. 2E is a time chart showing address data A(31:0) output from the CPU.
FIG. 2F is a time chart showing output data O(31:0) of the CPU.
FIG. 2G is a time chart showing a memory clock signal M-CK for use in a memory shown in FIG. 1.
FIG. 2H is a time chart showing a signal CSN1 output from the data write circuit based on the chip select signal CSN.
FIG. 2I is a time chart showing a signal WEN1 output from the data write circuit based on the write enable signal WEN.
FIG. 2J is a time chart showing address data A1(n:0), for use in the memory, that is output from the data write circuit based on address data A(31:2) of the CPU.
FIG. 2K is a time chart showing input data 11(31:0) of the memory.
FIG. 2L is a time chart showing output data O1(31:0) of the memory.

FIGS. 2A to 2L are time charts that are used to explain the overall operation of the computer circuitry of FIG. 1 for performing write operations on the memory 13 in units of bytes. As shown in FIG. 2E, the address data A(31:00) of the CPU 11 designate address 40000 in the duration between times t1 and t3, and then they designate address 40001 in the duration after time t3. That is, these charts are used to explain write operations of the CPU 11 that write data '1' at address 40000 and then write data '2' at address 40001. Specifically, in order to write data '1' to the memory 13, the CPU 11 provides output data O(31:00) consisting of four series of write data '01010101', which is shown in FIG. 2F. In order to write data '2' to the memory 13, the CPU 11 provides output data O(31:00) consisting of four series of write data '02020202'. FIG. 2A shows a system clock signal CPU-CK for the CPU 11. FIG. 2G shows a memory clock signal M-CK that is synchronized with the system clock signal CPU-CK and whose frequency is two times the frequency of the system clock signal CPU-CK.

In order to enable the aforementioned write operations in which the CPU 11 writes data '1' at address 40000 and then writes data '2' at address 40001, the CPU 11 outputs a chip select signal CSN (see FIG. 2B), a write enable signal WEN (see FIG. 2C), and access mode designation data DS (see FIG. 2D) as well as the aforementioned address data A(31:00) and output data O(31:00) at time t1. The chip select signal CSN is supplied to the NAND gate 16 shown in FIG. 1, wherein it is transmitted through the NAND gate 16 that is opened in response to the output of the decoder 17, so that the NAND gate 16 outputs a chip select signal CSN1 (see FIG. 2H) to the memory 13.

The OR gate 18 and the D flip-flop (DF) 19 convert the write enable signal WEN to a signal WEN1 (see FIG. 2I) that is synchronized with the memory clock signal M-CK. This signal WEN1 is supplied to the memory 13. The access mode designation data DS having a value '0' is supplied to the decoder 21, which in turn provides '1' at the output terminal '0' thereof Within the address data A(31:00), high-order address data A(31:2) are supplied to the address terminal of the memory 13 as address data A1(n:0), which is shown in FIG. 2J. Specifically, the address data A1(n:0) designate address 10000 in the duration between times t1 and t3. Within the address data A(31:00), the remaining low-order address data A(1) and A(0), both of which are presently set to '0', are supplied to the AND gates 23 to 28.

The time t1 corresponds to a leading edge of a pulse of the system clock signal CPU-CK as well as a leading edge of a pulse of the memory clock signal M-CK. At time t2 that corresponds to a leading edge of the next pulse of the memory clock signal M-CK, the memory 13 reads the contents of the address data A1(n:0) to output data O1(31:0) (see FIG. 2L) from the output terminal thereof Specifically, the memory 13 outputs data '0' as the output data O1(31:0) in the duration between times t2 and t3. The output data O1(31:0) of the memory 13 are supplied to the data input terminal of the CPU 11 as data I(31:0). They are also supplied to the input terminals '0' of the selectors 35 to 38 respectively.

When the AND gates 23 to 26 are supplied with the value (i.e., '1') of the output terminal '0' of the decoder 21, and the address data A1(1) and A(0) (both '0'), only the AND gate 26 outputs '1', which is supplied to the selector 38 via the OR gate 32. Thus, the selector 38 selects the input terminal '1' thereof, so that it selectively outputs 8-bit data consisting of bit 0 to bit 7 (namely, data '01', see FIG. 2F) of the output data O(31:00) of the CPU 11. That is, the selector 38 selectively outputs the 8-bit data to the data input terminal of the memory 13. All the remaining AND gates 23–25, 27, and 28 output '0', and all the remaining OR gates 29–31 output '0'. The output data O1(31:0) are divided into four elements, namely O1(31:24), O1(23:16), O1(15:8), and O1(7:0), which are respectively supplied to the input terminals '0' of the selectors 35 to 38. In the aforementioned condition, only the selector 38 selects the input terminal '1' thereof to provide the data '01' to the data input terminal of the memory 13, while the other selectors 35, 36, and 37 select the input terminals '0' thereof to provide the output data O1(31:24), O1(23:16), and O1(15,8) directly back to the data input terminal of the memory 13.

In summary, when both the address data A(1) and A(0) are set to '0', only the 8-bit data consisting of bit 0 to bit 7 of the output data O1(31:0) of the memory 13 are replaced by the 8-bit data consisting of bit 0 to bit 7 of the output data O(311:0) of the CPU 11, which are supplied to the data in put terminal of the memory 13 as a part of the input data I1(31:0)(see FIG. 2K). At time t2, when the write enable signal WEN 1 (see FIG. 2l) starts decreasing, the aforementioned input data I1(31:0) are written to the memory 13 at a specific address (i.e., address 10000) designated by the address data A1(n:0).

At time t3, the address data A(31:0) of the CPU 11 designate address 40000, the data write circuit 12 supplies to the memory 13 the address data A((n:0) that designate the foregoing address 10000 again. At time t4, the written contents of the memory 13 at address 10000 are read and supplied to the selectors 35 to 38 respectively. At this time, the address data A(1) and A(0) are respectively set to '0' and '1', while the decoder 21 outputs '1' at the output terminal '0' thereof. Therefore, the AND gate 25 outputs '1', which is supplied to the selector 37 via the OR gate 31. Thus, the selector 37 selects the input terminal '1' thereof to output 8-bit data consisting of bit 8 to bit 15 of the output data (31:0) of the CPU 11. As shown in FIG. 2F, the selector 37 selectively outputs data '02', which is supplied to the data input terminal of the memory 13. The other selector selectors 35, 36 and 38 select the input terminals '0' thereof to provide the output data O1(31:24), O1(23 :16), and O1(7:0) back to the data input terminal of the memory 13. At time t4 when the signal WEN1 starts decreasing, the aforementioned output data of the selectors 35 to 38 are written into the memory 13 at address 10000.

In the duration between times t1 and t3 in which the address data A(31:0) of the CPU 11 designate address 40000, the 8-bit data O(7:0) consisting of bit 0 to bit 7 of the output data O(31:0) of the CPU 11 are written to a part of the address 10000 ranging from bit 0 to bit 7. In the duration after time t3 in which the address data A(31:0) of the CPU 11 designate address 40001, the 8-bit data O(15:8) consisting of bit 8 to bit 15 of the output data O(31:0) of the CPU 11 are written to a part of the address 10000 ranging from bit 8 to bit 15.

2. Memory Half-Word Write

Figure 3:
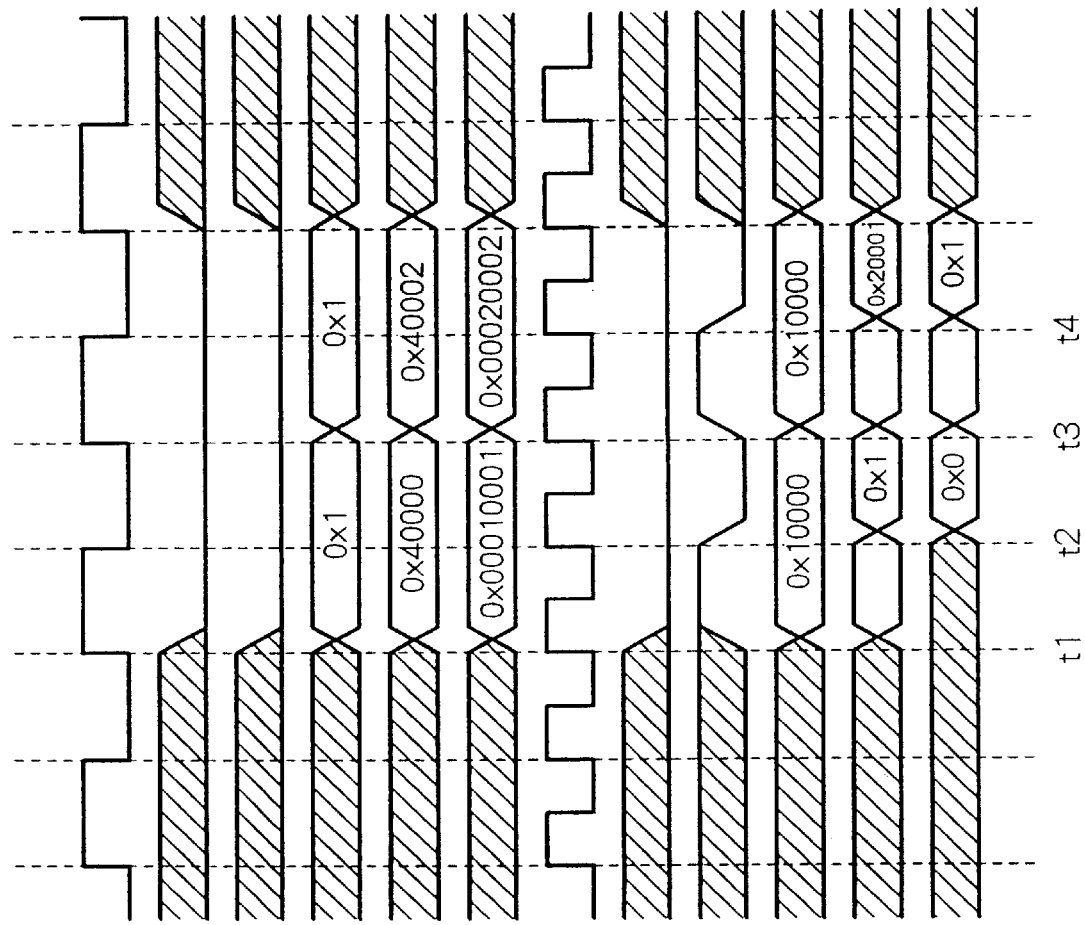
FIG. 3A is a time chart showing a system clock signal CPU-CK.
FIG. 3B is a time chart showing a chip select signal CSN.
FIG. 3C is a time chart showing a write enable signal WEN.
FIG. 3D is a time chart showing access mode designation data DS having a value '1'.
FIG. 3E is a time chart showing address data A(31:0) of the CPU.
FIG. 3F is a time chart showing output data O(31:0) of the CPU.
FIG. 3G is a time chart showing a memory clock signal M-CK.
FIG. 3H is a time chart showing a signal CSN1 output from the data write circuit based on the chip select signal CSN.
FIG. 3I is a time chart showing a signal WEN1 output from the data write circuit based on the write enable signal WEN.
FIG. 3J is a time chart showing address data A1(n:0) of the memory.
FIG. 3K is a time chart showing input data I1(31:0) of the memory.
FIG. 3L is a time chart showing output data 01(31:0) of the memory.

FIGS. 3A to 3L are time charts that are used to explain the overall operation of the computer circuitry for performing write operations on the memory 13 in units of half-words (i.e., 16 bits). As shown in FIG. 3E, the address data A(31:0) of the CPU 11 designate address 40000 in the duration between times t1 and t3, and then designate address 40002 in the duration after time t3. Hence, the CPU 11 writes data '1' to the memory 13 at address 40000, and then it writes data '2' to the memory 13 at address 40002. In order to write the data '1' into the memory 13, the CPU 11 provides two series of data '00010001' as the output data O(31:0) (see FIG. 3F). In order to write the data '2' into the memory 13, the CPU 11 provides two series of data '00020002' as the output data O(31:0). In this case, the CPU 11 outputs data '1' as the access mode designation data DS.

When the CPU 11 supplies the decoder 21 with the access mode designation data DS having a value '1', the decoder 21 outputs '1' at the output terminal '1' thereof, which is supplied to the AND gates 27 and 28 respectively. Both the address data A(1) and A(0) are set to '0' when the address data A(31:0) designate address 40000. At this time, the AND gate 28 outputs data '1', which is delivered to the selectors 37 and 38 via the OR gates 31 and 32. Thus, the selectors 37 and 38 select the input terminals '1' thereof to output the data O(15:8) and O(7:0) of the output data O(31:0) of the CPU 11, while the other selectors 35 and 36 select the input terminals '2' thereof to output the data O1(31:24) and O1(23:16) of the output data O1(31:0) of the memory 13. That is, the low-order sixteen bits of the output data O1(31:0) of the memory 13 are replaced with the low-order sixteen bits of the output data O(31:0) of the CPU 11. In other words, the low-order sixteen bits of the output data O(31:0) of the CPU 11 are newly written to the memory 13, while the high-order sixteen bits of the output data O1(31:0) are directly retained in the memory 13. In the next duration when the address data A(31:0) designate address 40002, the address data A(1) and A(0) are set to '1' and '0' respectively. At this time, the AND gate 27 outputs data '1', which is delivered to the selectors 35 and 36 via the OR gates 29 and 30. Thus, the selectors 35 and 36 select the input terminals '1' thereof to output the data O(31:24) and O(23:16) of the output data O(31:0) of the CPU 11, while the other selectors 37 and 38 select the input terminals '0' thereof to output the data O1(15:8) and O1(7:0) of the output data O1(31:0) of the memory 13. That is, the high-order sixteen bits of the output data O1 (31:0) of the memory 13 are replaced with the high order sixteen bits of the output data O(31:0) of the CPU 11. Hence, the high-order sixteen bits of the output data O(31:0) of the CPU 11 are newly written to the memory 13, while the low-order sixteen bits of the output data O1(31:0) are directly retained in the memory 13.

3. Memory Word Write

Figure 4:
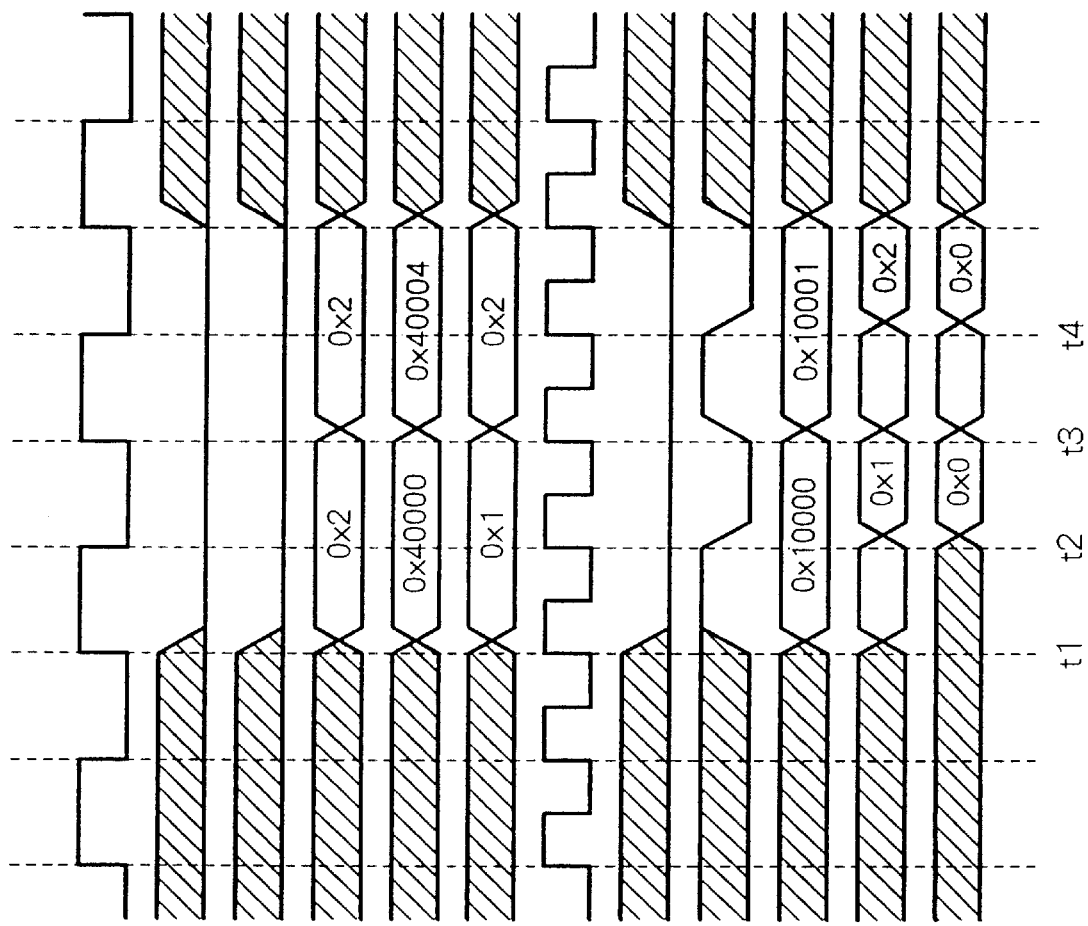
FIG. 4A is a time chart showing a system clock signal CPU-CK.
FIG. 4B is a time chart showing a chip select signal CSN.
FIG. 4C is a time chart showing a write enable signal WEN.
FIG. 4D is a time chart showing access mode designation data DS having a value '2'.
FIG. 4E is a time chart showing address data A(31:0) of the CPU.
FIG. 4F is a time chart showing output data O(31:0) of the CPU.
FIG. 4G is a time chart showing a memory clock signal M-CK.
FIG. 4H is a time chart showing a signal CSN1 output from the data write circuit based on the chip select signal CSN.
FIG. 4I is a time chart showing a signal WEN1 output from the data write circuit based on the write enable signal WEN.
FIG. 4J is a time chart showing address data A1(n:0) of the memory.
FIG. 4K is a time chart showing input data I1(31:0) of the memory.
FIG. 4L is a time chart showing output data O1(31:0) of the memory.

FIGS. 4A to 4L are time charts that are used to explain the overall operation of the computer circuitry for performing write operations on the memory 13 in units of words (i.e., 32 bits). As shown in FIG. 4E, the address data A(31:0) of the CPU 11 designate address 40000 in the duration between times t1 and t3, and then designate address 40004 in the duration after time t3. In this case, the CPU 11 writes data '1' into the memory 13 at address 40000, and then it writes data '2' into the memory 13 at address 40004. In response to the address data A(31:0) of the CPU 11 shown in FIG. 4E, the address data A1(n:0) of the memory 13 sequentially designate address 10000 and address 10001 in synchronization with address 40000 and address 40004 respectively. In addition, the CPU 11 sequentially produces write data '00000001' and '00000002'. Further, the CPU 11 provides the access mode designation data DS having a value '2'.

When the CPU 11 supplies the decoder 21 with the access mode designation data DS having a value '2', the decoder 21 outputs '1' at the output terminal '2 ' thereof, which is supplied to each of the OR gates 29 to 32. All the OR gates 29 to 32 output the same data '1' to each of the selectors 35 to 38. Therefore, all the selectors 35 to 38 select the input terminals '1' thereof to output the data O(31:24), O(23:16), O(15:8), and O(7:0) of the output data O(31:0) of the CPU 11. That is, all bits of the output data O(31:0) of the CPU 11 are supplied to the memory 13 via the selectors 35 to 38, wherein they are written to the address designated by the address data A1(n:0).

4. Memory Read FIGS. 5A to 5L are time charts that are used to explain the overall operation of the computer circuitry for performing read operations on the memory 13. Herein, the memory read mode is designed to enable read operations in units of words because even though the CPU 11 reads data from the memory 13 in units of words, it can process data in units of bytes therein. Hence, there is no need to provide different types of read operations that are performed in units of bytes and in units of half-words.

Figure 5:
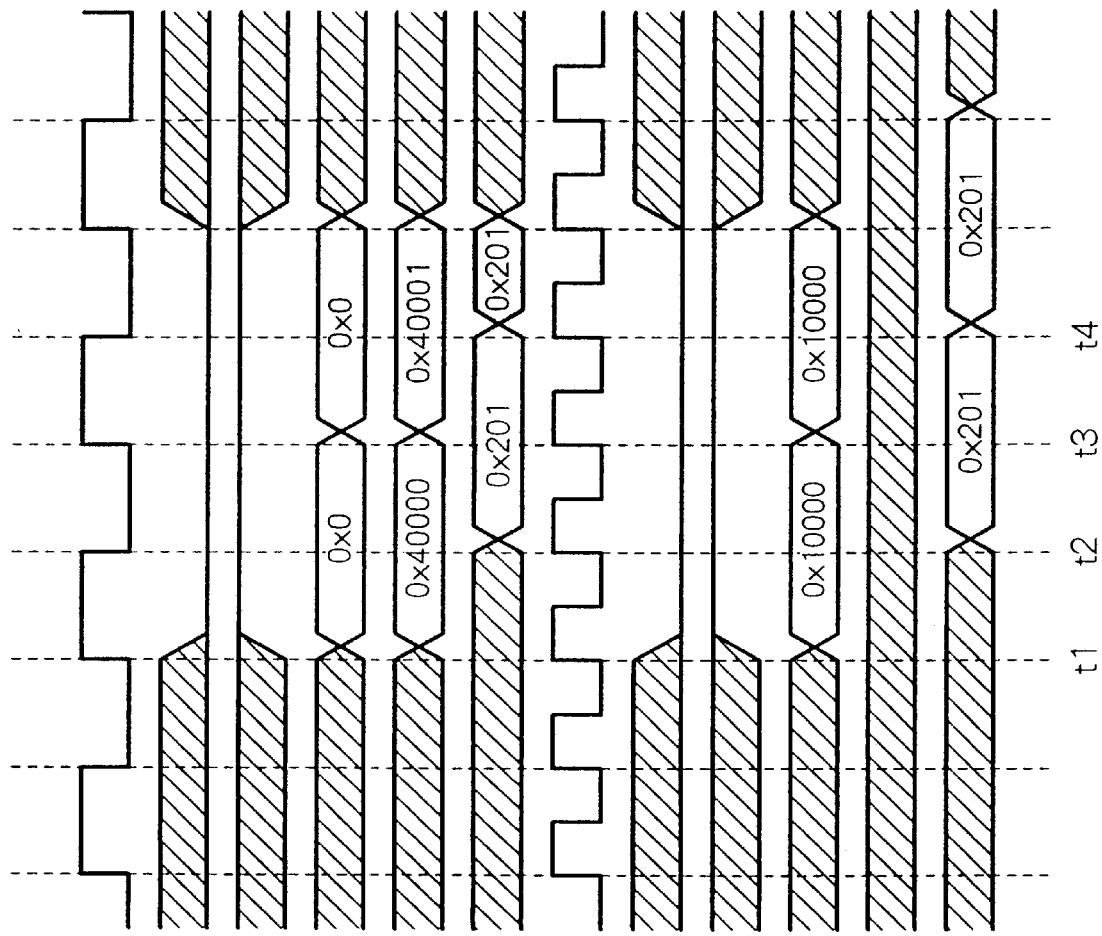
FIG. 5A is a time chart showing a system clock signal CPU-CK.
FIG. 5B is a time chart showing a chip select signal CSN.
FIG. 5C is a time chart showing a write enable signal WEN.
FIG. 5D is a time chart showing access mode designation data DS having a value '0'.
FIG. 5E is a time chart showing address data A(31:0) of the CPU.
FIG. 5F is a time chart showing input data I(31:0) of the CPU.
FIG. 5G is a time chart showing a memory clock signal M-CK.
FIG. 5H is a time chart showing a signal CSN1 output from the data write circuit based on the chip select signal CSN.
FIG. 5I is a time chart showing a signal WEN1 output from the data write circuit based on the write enable signal WEN.
FIG. 5J is a time chart showing address data A1(n:0) of the memory.
FIG. 5K is a time chart showing input data I1(31:0) of the memory.
FIG. 5L is a time chart showing output data O1(31:0) of the memory.
Figure 6:
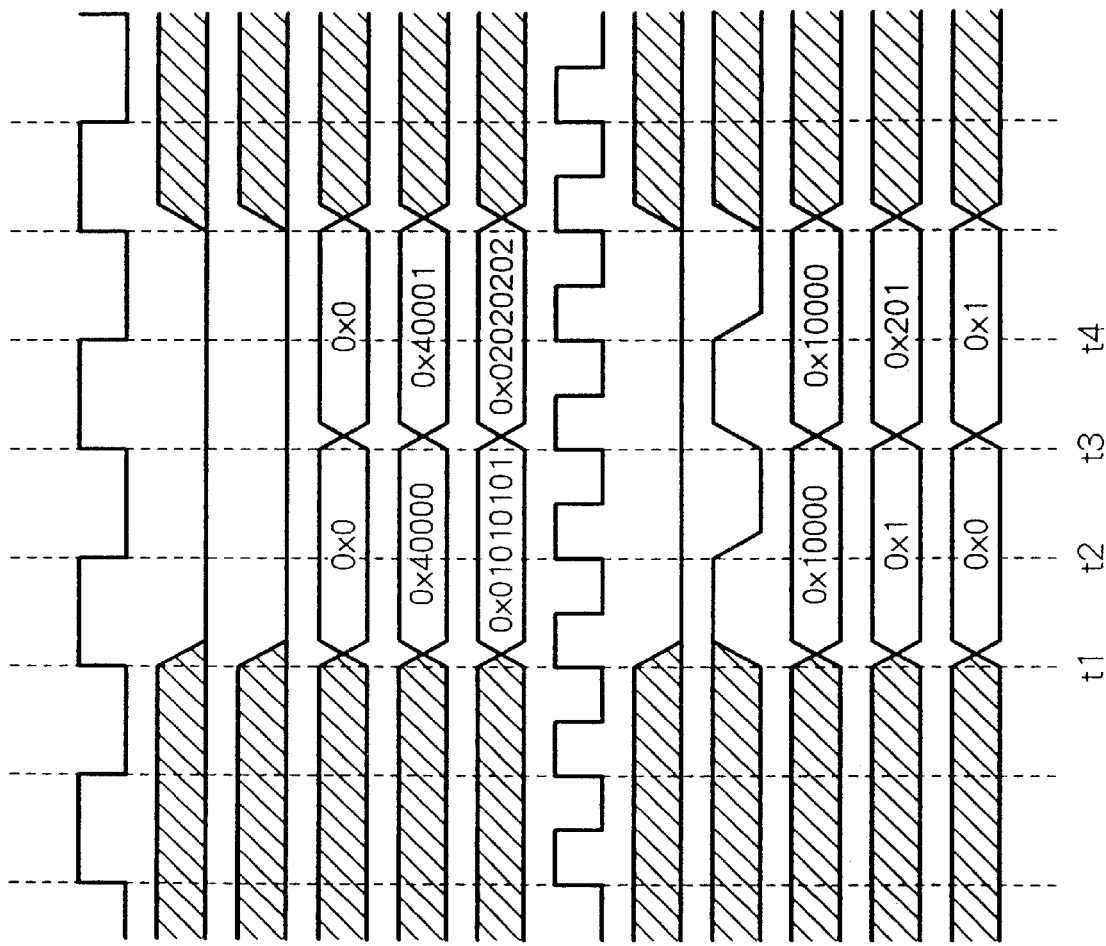
FIG. 6A is a time chart showing a system clock signal CPU-CK.
FIG. 6B is a time chart showing a chip select signal CSN.
FIG. 6C is a time chart showing a write enable signal WEN.
FIG. 6D is a time chart showing access mode designation data DS having a value '0'.
FIG. 6E is a time chart showing address data A(31:0) of the CPU.
FIG. 6F is a time chart showing output data O(31:0) of the CPU.
FIG. 6G is a time chart showing a memory clock signal M-CK.
FIG. 6H is a time chart showing a signal CSN1 output from the data write circuit based on the chip select signal CSN.
FIG. 6I is a time chart showing a signal WEN1 output from the data write circuit based on the write enable signal WEN.
FIG. 6J is a time chart showing address data A1(n:0) of the memory.
FIG. 6K is a time chart showing input data I1(31:0) of the memory.
FIG. 6L is a time chart showing output data O1(31:0) of the memory.

At time t1, the address data A(31:0) of the CPU 11 (see FIG. 5E) designate address 40000, so that the high-order thirty bits (namely, data '10000') are supplied to the address terminal of the memory 13 as the address data A1(n:0) (see FIG. 5J). At time t2, the CPU 11 starts reading data '201' (see FIG. 5L) from the memory 13, so that the read data are supplied to the data input terminal of the CPU 11 as the input data I(31:0) (see FIG. 5F). In the CPU 11, 8-bit data consisting of bit 0 to bit 7 of the input data I(31:0) are subjected to data processing. At time t3, the address data A(31:0) of the CPU 11 designate address 40001, whereas the address data A1(n:0) of the memory 13 still designate address 10000 (see FIG. 5J). At time t4, the same data '201' are read from the memory 13 and are then supplied to the data input terminal of the CPU 11, which is shown in FIGS. 5F and 5L. In the CPU 11, 8-bit data consisting of bit 8 to bit 15 of the input data I(31:0) are subjected to data processing.

5. Register Byte Write

FIGS. 6A to 6L are time charts for explaining the write operations that are performed in units of bytes in the computer circuitry of FIG. 1, which is modified to use a (32×M-bit) register '13a' instead of the memory 13. Similar to the aforementioned memory byte write mode, the CPU 11 provides the access mode designation data DS having a value '0', which is supplied to the decoder 21. Hence, the decoder 21 outputs '1' at the output terminal '0' thereof, which is supplied to each of the AND gates 23 to 26. As a result, only one selector is designated by the low order address data A(1) and A(0) of the address data A(31:0) of the CPU 11 and is selected from among the selectors 35 to 38, so that the selected selector outputs a prescribed 8-bit part of the output data O(31:0) of the CPU 11 to the register 13a. Thus, the output data O1(31:0) of the register 13a, a part of which is replaced with the prescribed 8-bit part of the output data O(31:0) of the CPU 11, are written into the register 13a.

Specifically, at time t1, the address data A(31:0) of the CPU 11 (see FIG. 6E) designate address 40000, so that the register 13a is supplied with the address data A1(n:O) designating address 10000. Hence, data '0' is read from the register 13a and is supplied to each of the selectors 35 to 38, for example. Both the low-order address data A(1) and A(0) are set to '0' when the address data A(31:0) designate address 40000 in the duration between times t1 and t3. Therefore, only the AND gate 26 outputs data '1', which is supplied to the selector 38 via the OR gate 32. Thus, the selector 38 selects the input terminal '1' thereof to output the data O(7:0) consisting of bit 0 to bit 7 of the output data O(31:0) of the CPU 11. That is, the output data O1(31:0) of the register 13a, whose low-order 8-bit portion consisting of bit 0 to bit 7 is replaced with the low-order 8-bit data O(7:0) of the CPU 11, are supplied to the data input terminal of the register 13a as the input data I1(31:0). At time t3 when the signal WEN1 starts increasing, the input data I1(31:0) are written into the register 13a, and then they are output from the data output terminal of the register 13a (see FIG. 6L).

6. Register Half-Word Write

FIGS. 7A to 7L are time charts for explaining the write operations that are performed in units of half-words in the computer circuitry of FIG. 1 that use the register 13a instead of the memory 13. In this case, the CPU 11 outputs the access mode designation data DS having a value '1' to the decoder 21. Details of the register half-word write mode are similar to the foregoing memory half-word write mode, which was described in conjunction with FIGS. 3A to 3L. As a result, the output data O1(31:0) of the register 13a, whose high-order 16-bit portion or low-order 16-bit portion is replaced with the corresponding portion of the output data O(31:0) of the CPU 11, are written into the register 13a.

7. Register Word Write

FIGS. 8A to 8L are time charts for explaining the write operations that are performed in units of words in the computer circuitry of FIG. 1 that uses the register 13a instead of the memory 13. In this case, the CPU 11 outputs the access mode designation data DS having a value '2' to the decoder 21. Details of the register word write mode are similar to the foregoing memory word write mode, which was described in conjunction with FIGS. 4A to 4L. As a result, the output data O(31:0) of the CPU 11 are entirely supplied to the data input terminal and are written into the register 13a.

8. Register Read

FIGS. 9A to 9L are time charts for explaining the read operations that are performed in the computer circuitry of FIG. 1 that uses the register 13a instead of the memory 13. Details of the register read mode are similar to the foregoing memory read mode, which was described in conjunction with FIGS. 5A to 5L.

Next, an example of the application of the data write circuit will be described with reference to FIG. 10, which is a block diagram showing the configuration of a decoder for use in an AV amplifier. In FIG. 10, a CPU 40 accesses a memory bank 43 or a register bank 44 via an internal memory interface 41 and a memory management unit (MMU) 42. Thus, the CPU 40 performs read/write operations on the memory bank 43 or the register bank 44. In addition, a DSP 45 accesses the memory bank 43 or the register bank 44. The aforementioned data write circuit of this invention can be installed in the internal memory interface 41 to enable write operations in units of bytes or in units of half-words with respect to the memory bank 43 or the register bank 44.

As described heretofore, the data write circuit of this invention performs write operations in prescribed units of bits between the CPU and memory (or register), each of which operates based on the same number of bits (e.g., thirty-two bits). Specifically, the data write circuit of this invention requires a single memory (or register) to perform write operations in prescribed units of bits (e.g., bytes, half-words), the number of which is reduced compared with the original number of bits (e.g., words), without using multiple memories. As a result, this invention contributes to a noticeable reduction in the overall area of the memory chip, which may be reduced by approximately 20% compared with the conventional circuitry.

As this invention may be embodied in several forms without departing from the spirit or essential characteristics thereof, the present embodiment is therefore illustrative and not restrictive, since the scope of the invention is defined by the appended claims rather than by the description preceding them, and all changes that fall within metes and bounds of the claims, or equivalents of such metes and bounds are therefore intended to be embraced by the claims.

What is claimed is:

1. A data write circuit for assisting write operations of data between a controller and a memory both of which operate based on the same number of bits, said data write circuit comprising:

a plurality of selectors, each of which has a first input for receiving first data read from the memory in response to address data produced by the controller to designate a specific address for the memory, and a second input for receiving second data output from the controller, so that each selector selectively outputs either the first data or the second data in response to a selection signal; and a selection signal generator for generating the selection signal based on low-order bits of the address data, and access mode designation data output from the controller.

2. A data write circuit according to claim 1, wherein the controller is a CPU, and the memory is a semiconductor memory.

3. A data write circuit according to claim 1, wherein the memory is constituted as a register.

4. A data write circuit according to claim 2, wherein the memory is constituted as a register.

5. A data write circuit according to claim 1, wherein the memory performs read/write operations in units of thirty-two bits, and each selector selects either the first data consisting of eight bits or the second data consisting of eight bits in response to the selection signal.

6. A data write circuit that is interposed between a memory and a controller for producing address data and access mode designation data, both of which operates based on the same number of bits, said data write circuit comprising:

a decoder for decoding the access mode designation data to designate one of a byte access mode, a half-word access mode, and a word access mode;

a logic circuit for generating a plurality of selection signals based on the output of the decoder and low-order bits of the address data; and a plurality of selectors, each of which selectively outputs either first data read from the memory in response to the address data, or second data provided from the controller in response to the selection signal.

7. A data write circuit according to claim 6, wherein both the controller and the memory operates based on thirty-two bits, and four sets of the selectors and the selection signals are provided in such a way that each selector selects either the first data consisting of eight prescribed bits or the second data consisting of eight prescribed bits in response to the selection signal.

8. A data write circuit according to claim 7, wherein when the access mode designation data designates the byte access mode, one of the selectors is forced to select the second data, which are substituted for the first data in the memory.

9. A data write circuit according to claim 7, wherein when the access mode designation data designates the half-word access mode, two of the selectors are each forced to select the second data, which are substituted for the first data in the memory.

10. A data write circuit according to claim 7, wherein when the access mode designation data designates the word access mode, all the selectors are each forced to select the second data, which are substituted for the first data.

* * * * *